(12) United States Patent
Li et al.

(10) Patent No.: US 9,135,985 B2
(45) Date of Patent: Sep. 15, 2015

(54) MEMORY CELL

(71) Applicant: International Business Machines Corporation, Armonk, NY (US)

(72) Inventors: Xiao Xiao Li, Shanghai (CN); Chao Meng, Shanghai (CN); Xu Chen Zhang, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/037,830

(22) Filed: Sep. 26, 2013

(65) Prior Publication Data

US 2014/0092673 A1 Apr. 3, 2014

(30) Foreign Application Priority Data

Sep. 28, 2012 (CN) .......................... 2012 1 0367153

(51) Int. Cl.
| | |
|---|---|
| *G11C 8/16* | (2006.01) |
| *G11C 11/412* | (2006.01) |
| *G11C 7/10* | (2006.01) |
| *G11C 11/413* | (2006.01) |

(52) U.S. Cl.
CPC ............ *G11C 11/412* (2013.01); *G11C 7/1075* (2013.01); *G11C 11/413* (2013.01)

(58) Field of Classification Search
CPC ......................................................... G11C 8/16
USPC ..................................................... 365/230.05
See application file for complete search history.

(56) References Cited

U.S. PATENT DOCUMENTS

| 5,469,380 | A | * | 11/1995 | Iio ................................... 365/154 |
|---|---|---|---|---|
| 5,535,159 | A | * | 7/1996 | Nii ............................ 365/189.05 |
| 5,539,341 | A | * | 7/1996 | Kuo ............................... 327/108 |
| 7,269,055 | B2 | | 9/2007 | Lin et al. |
| 7,411,813 | B2 | * | 8/2008 | Maki ............................. 365/154 |
| 7,773,407 | B2 | | 8/2010 | Huang et al. |
| 7,986,566 | B2 | | 7/2011 | Houston |
| 8,077,527 | B2 | | 12/2011 | Zampaglione et al. |
| 8,681,534 | B2 | * | 3/2014 | Kohli et al. .................... 365/154 |
| 2006/0002223 | A1 | | 1/2006 | Song et al. |
| 2007/0242498 | A1 | * | 10/2007 | Chandrakasan et al. ...... 365/154 |
| 2012/0008449 | A1 | | 1/2012 | Chuang et al. |
| 2012/0250430 | A1 | * | 10/2012 | Ghassemi et al. ........ 365/189.16 |

OTHER PUBLICATIONS

Prabhu, C.M.R.—9T balanced SRAM cell for low power operation—Industrial Electroniics & Applications—Ieee Explore—vol. 1, 2009.
Lin, Sheng, et al.—A Low Leakage 9T SRAM Cell for Ultra-Low Power Operation—GLSVLST'08, May 4-6, 2008.

(Continued)

*Primary Examiner* — Son Mai
(74) *Attorney, Agent, or Firm* — H. Daniel Schnurmann

(57) ABSTRACT

This invention relates generally to a memory cell. The embodiments of the present invention provide a SRAM cell and a SRAM cell array comprising such SRAM cell. The SRAM cell according to the embodiments of the present invention includes a pull-up transistor and a pull-down transistor, such that it is unnecessary to pre-charge a pre-read bit line at the time of performing read operation. By adopting the method of the present invention, generation of leakage current can be suppressed and hence power consumption of SRAM chip can be reduced.

2 Claims, 4 Drawing Sheets

(56) References Cited

OTHER PUBLICATIONS

Rani, M. Janaki, et al.—A Novel Design of a 9T SRAM Cell with Reduced Leakage for Embedded Cache Memory Application—European Journal of Scientific Research—ISSN 1450-216X vol. 81 No. 1 (2012), pp. 93-102.

Yadav, Monika, et al.—Analysis of Leakage Reduction Technique on Different SRAM Cells—ISSN: 2231-5381 International Jourmal of Engineering Trends and Technology—vol. 2 Issue 3—2011.

Tu, Ming-Hsien, et al.—Single-Ended Subthreshold SRAM With Asymmetrical Write/Read-Assist—IEEE Transactions on Circuits and Systems—Regular Papers, vol. 57, No. 12—Dec. 2010.

Noguchi, Hiroki, et al.—Which is the Best Dual-Port SRAM in 45-nm ProcessTechnology?—8T, 10T Single End, and 10T Differential—978-14244-1811-4—2008 IEEE.

China Application No. 201210367153.0 Filed Sep. 28, 2012 IDS—Backgroud Art.

* cited by examiner

MEMORY CELL

CROSS-REFERENCE STATEMENT

This application claims priority under 35 U.S.C. §119 from Chinese Patent Application No. 201210367153.0 filed Sep. 28, 2012, the entire contents of which are incorporated herein by reference.

BACKGROUND

1. Field of the Invention

The present invention relates generally to circuit techniques, and more specifically, to a memory cell.

2. Related Art

Static random-access memory (SRAM) is an important type of memory. Typical SRAM configuration includes an SRAM cell and a sense amplifier. An SRAM cell is a basic unit in SRAM chip for storing logic values. SRAM cell itself has a limited driving ability, which cannot meet the requirement for driving post stage logic circuits. A sense amplifier is employed for processing signals outputted from SRAM cell. A sense amplifier is capable of driving post stage logic circuits due to its stronger driving ability. A sense amplifier usually is multiplexed by a plurality of SRAM cells.

FIG. 1 is a structure of a conventional SRAM cell, in which, logic values are stored in a circuit consisting of M1, M2, M3 and M4 and this part forms a core memory circuit. WWL is used for controlling transistors M5 and M6 to select the SRAM cell for performing a write operation. WBL and /WBL are used for inputting to the SRAM cell a value to be written. This part forms a write-related circuit. RWL is used for controlling transistor M8 to select the SRAM cell for performing a read operation. RBL is used for reading out values stored in the SRAM cell. If the values stored in the SRAM cell correspond to producing a low level on RBL, M7 is turned on by a high level at an output node NC of the core memory circuit. If the values stored in the SRAM cell correspond to producing a high level on RBL, M7 is cut off by a low level at the node NC. This part forms a read-related circuit.

In the above-described structure, RBL is pre-charged to a high level. That is to say, RBL is always at a high level unless a low level needs to be outputted. During a read operation, pre-charging RBL is stopped. Then, M8 is turned on by a high level on RWL, so as to select the SRAM cell. In the case where M7 is also turned on, a path is formed from RBL to a reference level, so as to pull down the level on RBL from a high level to a low level.

After the read operation is finished, M8 is cut off by the low level on RWL and the pre-charge circuit is re-connected to RBL, and thus RBL resumes a high level. When M7 is cut off, there is no path formed between RBL and the reference level, and thus RBL still maintains a high level. When the read operation is finished, M8 is cut off by the low level on RML and the pre-charge circuit is re-connected to RBL, which is still at a high level.

One of ordinary skill in the art can understand that, even if the transistor is in an OFF state, there exists a weak current flowing between a source and a drain because of a potential difference between the source and the drain of the transistor. This weak current is referred to as leakage current. This leakage current is related to the potential difference between a source and a drain as well as related to the dimension of a transistor channel. In order to make RBL switch rapidly from a high level to a low level when a low level needs to be outputted, M8 usually has a relatively large dimension of channel for rapidly forming a path from RBL to reference level.

However, the large dimension of M8 means a relatively large leakage current existing in M8. As described above, whether M7 is turned on depends on logic values stored in the SRAM cell. Assumed that the probabilities of having logic value 0 stored in SRAM cell and having logic value 1 stored in SRAM cell both are 50%, M7 is in an ON state for half the time.

Accordingly, within half the working time of the SRAM cell, there is a relatively large leakage current flowing from RBL to reference level. Although the leakage current is much smaller than working current, its influence on power consumption cannot be ignored since it always exists.

Therefore, a new technical solution is desirable for improving leakage current performance of SRAM cell.

SUMMARY OF THE INVENTION

One aspect of the invention includes an SRAM cell including a core memory circuit and a write-related circuit. The SRAM cell further includes: a first transistor, a second transistor, and a third transistor, where one of a source and a drain of the first transistor is connected to a working level, while the other one is connected to an intermediate output node, one of a source and a drain of the second transistor is connected to a reference level while the other one is connected to the intermediate output node, gates of the first transistor and the second transistor both are connected to an output node of the core memory circuit, one of the first transistor and the second transistor is an N-type transistor and the other is a P-type transistor, one of a source and a drain of the third transistor is connected to the intermediate output node, while the other one is connected to a read bit line, and a gate of the third transistor is connected to a read word line.

Another aspect of the invention includes an SRAM cell array. The SRAM includes a plurality of SRAM cells, where, the SRAM cell includes a core memory circuit and a write-related circuit, and further includes: a first transistor, a second transistor and a third transistor, where: one of a source and a drain of the first transistor is connected to a working level, while the other one is connected to an intermediate output node, one of a source and a drain of the second transistor is connected to a reference level, while the other one is connected the intermediate output node, gates of the first transistor and the second transistor both are connected to an output node of the core memory circuit, one of the first transistor and the second transistor is an N-type transistor while the other one is a P-type transistor, and one of a source and a drain of the third transistor is connected to the intermediate output node, while the other one is connected to a read bit line, and a gate of the third transistor is connected to a read word line.

BRIEF DESCRIPTION OF THE DRAWINGS

Through the more detailed description of some embodiments of the present disclosure in the accompanying drawings, the above and other objects, features and advantages of the present disclosure will become more apparent, where the same reference generally refers to the same components in the embodiments of the present disclosure.

DETAILED DESCRIPTION OF THE PREFERRED EMBODIMENTS

Figure 1:
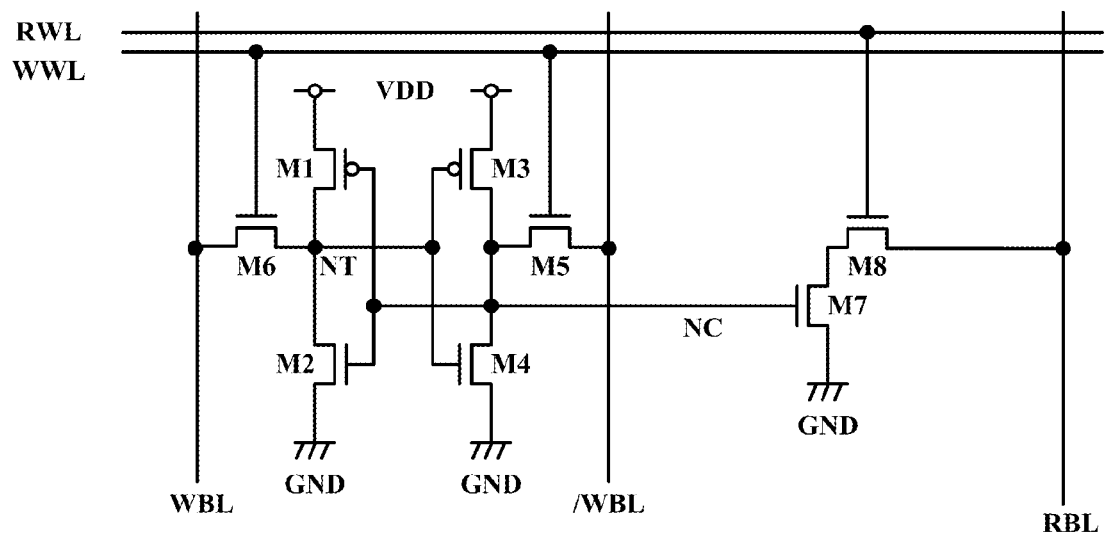
FIG. 1 is a typical circuit of a SRAM cell.

The embodiments of the present invention provide a SRAM cell and a SRAM cell array including such SRAM cell.

The SRAM cell according to the embodiments of the present invention includes a core memory circuit and a write-related circuit, and further includes: a first transistor (M11), a second transistor (M12) and a third transistor (M32), where, one of a source and a drain of the first transistor is connected to a working level while the other one is connected to an intermediate output node (IOUT), one of a source and a drain of the second transistor is connected to a reference level while the other one is connected the intermediate output node, gates of the first transistor and the second transistor both are connected to an output node (NC) of the core memory circuit, one of the first transistor and the second transistor is an N-type transistor while the other one is a P-type transistor, one of a source and a drain of the third transistor is connected to the intermediate output node while the other one is connected to a read bit line (RBL), and a gate of the third transistor is connected to a read word line.

One of the source and the drain of the first transistor is connected to the working level via a fourth transistor (M21), one of a source and a drain of the fourth transistor is connected to one of the source and the drain of the first transistor while the other one of a source and a drain of the fourth transistor is connected to the working level, a gate of the fourth transistor is connected to a first read control signal (VVDD_C), which enables the fourth transistor to be turned on during period of performing read operation on the SRAM cell.

One of the source and the drain of the second transistor is connected to the reference level via a fifth transistor (M22), one of a source and a drain of the fifth transistor is connected to one of the source and the drain of the second transistor while the other one of a source and a drain of the fifth transistor is connected to the reference level, a gate of the fifth transistor is connected to a second read control signal (VGND_C), which enables the fifth transistor to be turned on during period of performing read operation on the SRAM cell.

The fourth transistor has a channel dimension larger than that of the first transistor, the second transistor and the third transistor.

The SRAM cell further includes a sixth transistor (M31), one of a source and a drain of the sixth transistor is connected to the intermediate output node while the other one is connected to the read bit line (RBL), a gate of the sixth transistor is connected to an reverse signal of the read word line, where, one of the third transistor and the sixth transistor is an N-type transistor and the other one is a P-type transistor.

A SRAM cell array according to the embodiments of the present invention includes a plurality of SRAM cells, where, the SRAM cell includes a core memory circuit and a write-related circuit, and further includes: a first transistor (M11), a second transistor (M12) and a third transistor (M32), where, one of a source and a drain of the first transistor is connected to a working level while the other one is connected to an intermediate output node (IOUT), one of a source and a drain of the second transistor is connected to a reference level while the other one is connected the intermediate output node, gates of the first transistor and the second transistor both are connected to an output node (NC) of the core memory circuit, one of the first transistor and the second transistor is an N-type transistor while the other one is a P-type transistor, one of a source and a drain of the third transistor is connected to the intermediate output node while the other one is connected to a read bit line (RBL), and a gate of the third transistor is connected to a read word line.

The third transistor is an N-type transistor, the SRAM cell further includes a seventh transistor (M41) and an inverter, where one of a source and a drain of the seventh transistor is connected to the working level while the other one is connected to an input of the inverter, an output of the inverter is connected to a gate of the seventh transistor, and the input of the inverter is further connected to the read bit line.

The third transistor is a P-type transistor, the SRAM cell further includes a eighth transistor (M42) and an inverter, one of a source and a drain of the eighth transistor is connected to the reference level while the other one is connected to an input of the inverter, an output of the inverter is connected to a gate of the eighth transistor, and the input of the inverter is further connected to the read bit line.

One of the source and the drain of the first transistor is connected to the working level via a fourth transistor (M21), one of a source and a drain of the fourth transistor is connected to one of the source and the drain of the first transistor while the other one of a source and a drain of the fourth transistor is connected to the working level, a gate of the fourth transistor is connected to a first read control signal (VVDD_C), which enables the fourth transistor to be turned on during period of performing read operation on the SRAM cell.

One of the source and the drain of the second transistor is connected to the reference level via a fifth transistor (M22), one of a source and a drain of the fifth transistor is connected to one of the source and the drain of the second transistor while the other one of a source and a drain of the fifth transistor is connected to the reference level, a gate of the fifth transistor is connected to a second read control signal (VGND_C), which enables the fifth transistor to be turned on during period of performing read operation on the SRAM cell.

The fourth transistor has a channel dimension larger than that of the first transistor, the second transistor and the third transistor.

The technical solution provided in the embodiments of the present invention can suppress leakage current and thus reduces power consumption of SRAM chip.

Below, with reference to the accompanying drawings, the present invention will be described in conjunction with the particular embodiments. Such description is illustrative but not intended to limit the scope of the present invention. The accompanying drawings are given by way of examples and thus are not drawn to scale. In addition, when describing that a first element is connected to a second element, it means that the first element not only can be directly connected to the second element, but also can be indirectly connected to the second element by means of a third element. Furthermore, some elements which are unnecessary for thoroughly understanding the present invention are omitted for clarity. In the figures, similar and corresponding elements are represented by similar reference numbers.

One of ordinary skill in the art can appreciate that, in a digital circuit, there is a symmetric relation between level and device type. For example, an ON level for an N-type transistor is a high level while an ON level for a P-type transistor is a low level. Thus, conditions for high and low levels involved in the following description can vary by modifying types of relevant devices. In addition, the illustrated conditions also can be varied by adding additional devices.

For example, as for an N-type transistor that is turned on by a high level, if a non-gate device is added between input signal and gate of the N-type transistor, this transistor can be turned on when the input signal is at a low level. Such modifications all are equivalent to the embodiments of the present invention as described below and fall within the claimed scope of the present patent.

Figure 2:
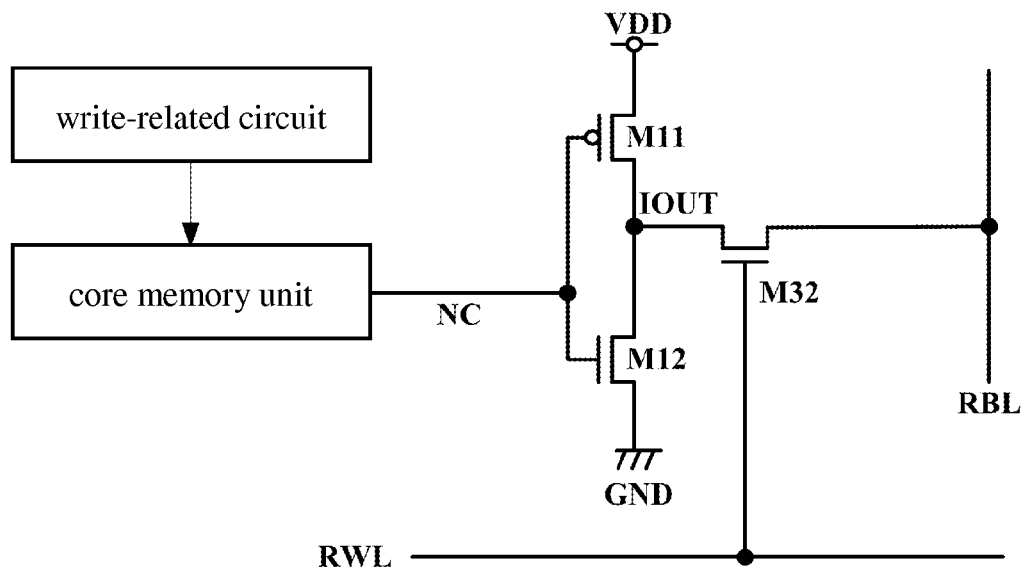
FIG. 2 is a schematic view of an SRAM cell according to an embodiment of the present invention.

FIG. 2 shows a structural view of a SRAM cell according to an embodiment of the present invention. In FIG. 2, the core memory circuit and the write-related circuit can be the same as the corresponding parts of FIG. 1. One of ordinary skill in the art also can employ other alternative solutions to implement the core memory circuit and the write-related circuit.

As shown in FIG. 2, an output NC of the core memory circuit is connected to the gates of transistor M11 and transistor M12, one of a source and a drain of M11 is connected to a working level while the other one is connected to a node IOUT. One of a source and a drain of M12 is connected to the node IOUT while the other one is connected to a reference level. One of transistor M11 and transistor M12 is an N-type transistor while the other one is a P-type transistor. It is assumed in FIG. 2 that M11 is a P-type transistor while M12 is an N-type transistor. One of a source and a drain of transistor M32 is connected to the node IOUT while the other one is connected RBL. The gate of transistor M32 is connected to RWL.

At the time of performing a read operation, transistor M32 is turned on. At this point, if node NC is at a low level, M11 is turned on while M12 is cut off, thereby forming a conductive path from the working level through M11 and M32 to RBL, and thus, RBL is pulled up to a high level. If node NC is at a high level, M12 is turned on while M11 is cut off, thereby forming a conductive path from RBL through M32 and M12 to the reference level, and thus RBL is pulled down to a low level.

Different from the structure shown in FIG. 1, in the structure shown in FIG. 2, RBL does not need to be pre-charged to a high level. In such way, a potential difference across the series circuit consisting of M32 and M12 is significantly reduced relative to a potential difference across the series circuit consisting of M8 and M7.

As described above, the leakage current is related to a potential difference between a source and a drain as well as the dimension of a transistor channel. When the potential difference is relatively small, even though M32 has a large channel dimension, a large leakage current will not be produced on a path from RBL through M32 and M12 to reference level. Thus, in the structure shown in FIG. 2, transistor M32 can be configured as having a relatively large channel dimension for quickening the speed of a read operation and meanwhile reducing leakage current. Similarly, because RBL is not pre-charged to a low level, even if M32 has a relatively large channel dimension, a large leakage current will not be produced on the path from working level through M11 and M32 to RBL.

Generally speaking, RBL is shared among a plurality of SRAM cells. In the case when one SRAM cell is performing output from RBL, RBL is pulled up to a high level or pulled down to a low level by the SRAM cell. In such case, as for another SRAM cell connected to the same RBL, if RBL is at a low level, there exists a potential difference between the working level and the RBL; if RBL is at a high level, there exists a potential difference between the RBL and the reference level. Leakage current produced because RBL is pre-charged to a high level or a low level can be called as static leakage current, while leakage current produced when RBL is outputting data stored in the SRAM cell can be called as dynamic leakage current. Static leakage current is always present as long as the SRAM chip is electrified, while dynamic leakage current is present only when outputting is performed on RBL.

Figure 3:
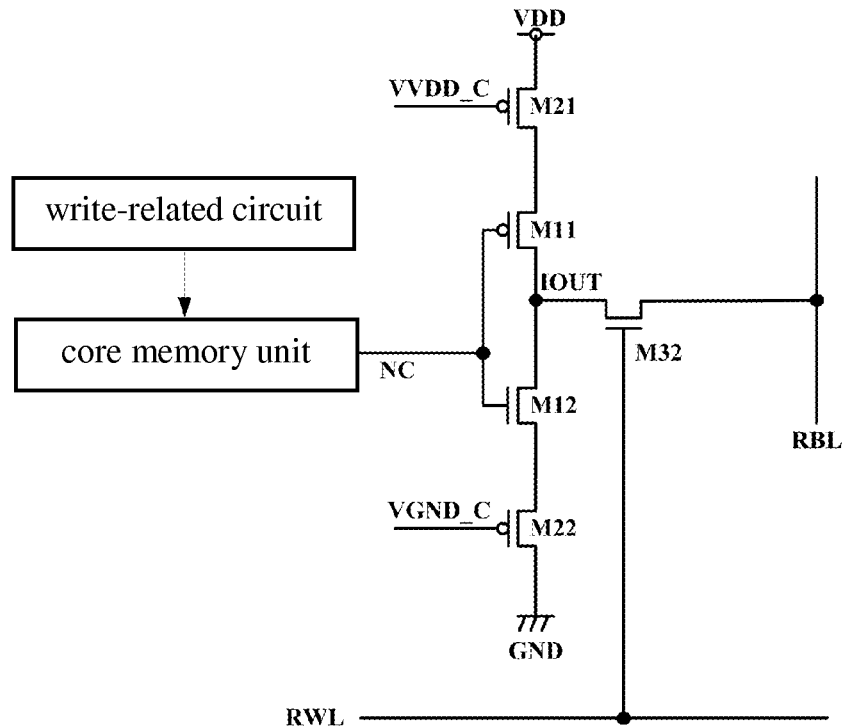
FIG. 3 is a schematic view of an SRAM cell according to an embodiment of the present invention.

In order to further suppress dynamic leakage current in the structure shown in FIG. 2, a SRAM cell according to another embodiment of the present invention is shown in FIG. 3. Compared to the structure shown in FIG. 2, in FIG. 3, a transistor M21 is further connected between transistor M11 and the working level, and a transistor M22 is further connected between transistor M12 and the reference level.

One of a source and a drain of transistor M21 is connected to transistor M11 while the other one is connected to the working level. One of a source and a drain of transistor M22 is connected to transistor M12 while the other one is connected to the reference level. Gates of transistor M21 and M22 are respectively connected to control signals VVDD_C and VGND_C.

In the structure shown in FIG. 3, transistors M21 and M22 are turned on only when it needs to perform a read operation on the SRAM cell. In such way, even though RBL is at a low level due to output of other SRAM cell, dynamic leakage current on a path from working level through M21, M11 and M32 to RBL is very small because M21 and M11 both are not turned on.

Similarly, even though RBL is at a high level due to output of other SRAM cell, dynamic leakage current on a path from RBL through M32, M12 and M22 to reference level is very small because M22 and M12 both are not turned on.

It needs to be noted that, although FIG. 3 shows transistors M21 and M22, it does not means these two transistors must exist concurrently. In the case of a limited area of circuit, only one of them can be reserved and meanwhile an effect of reducing the dynamic leakage current still can be achieved. In addition, since transistors M21 and M22 are turned on when a read operation is performed on SRAM cell, they can have a relatively large channel dimension so as to quicken the speed of the read operation. Typically, the channel dimension of M21 and M22 can be two or three times of that of M11 and M12.

In the structures shown in FIGS. 2 and 3, either the pull-up path from working level to RBL or the pull-down path from reference level to RBL passes through transistor M32. If transistor M32 is an N-type transistor, an obvious potential difference will be produced across transistor M32 at the time of pulling up RBL to the working level. In other words, it will make the high level on RBL obviously smaller than the working level.

If transistor M32 is a N-type transistor, an obvious potential difference will be produced across transistor M32 at the time of pulling down RBL to the reference level. In other words, it will make the low level on RBL obviously higher than the reference level. Such level loss may cause the driving ability of SRAM cell to be further weakened. To overcome this problem, a SRAM cell according to one embodiment of the present invention is shown in FIG. 4A.

Figure 4A:
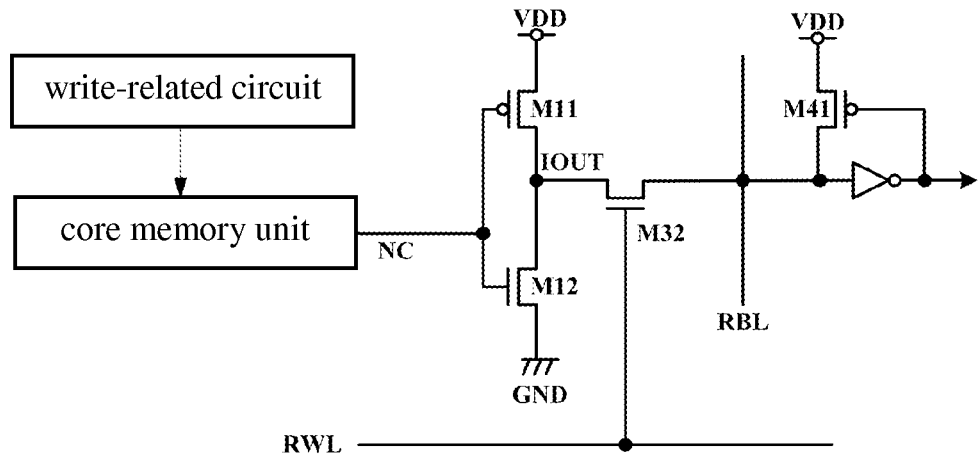
FIG. 4A is a schematic view of an SRAM cell according to an embodiment of the present invention.

In FIG. 4A, a P-type transistor M41 and an inverter together form a positive feedback circuit. Specifically speaking, one of a source and a drain of M41 is connected to RBL while the other one is connected to the working level. The input of the inverter is connected to RBL while the output is connected to the gate of M41. If RBL is at a high level due to the output of SRAM cell, the inverter changes the logic high level to a logic low level. As long as the logic low level is lower than a low level required for turning on the P-type transistor, the P-type transistor is turned on, and thus RBL is further pulled up to a high level close to the working level.

It can be seen that, this positive feedback circuit is good for compensating the degradation of RBL high level driving ability caused by the N-type transistor M32. If RBL is at a low level due to the output of SRAM cell, because a potential difference across the N-type transistor M32 produced at the time of pulling down RBL to the reference level is small, the low level on RBL is already very close to the reference level. At this point, the output of the inverter is a high level such that the P-type transistor is cut off.

After introducing the positive feedback circuit as shown in FIG. 4A, the high level on RBL becomes closer to the working level, such that the dynamic leakage current flowing from RBL through M32 and M12 to reference level at the time when RBL is at a high level will be increased. Accordingly, transistor M22 can be added as shown in FIG. 3.

As described above, if transistor M32 is a P-type transistor, the low level on RBL is made to be obviously larger than the reference level, which causes RBL low level driving ability to be degraded. To solve this problem, a SRAM cell according to one embodiment of the present invention is shown in FIG. 4B.

Figure 4B:
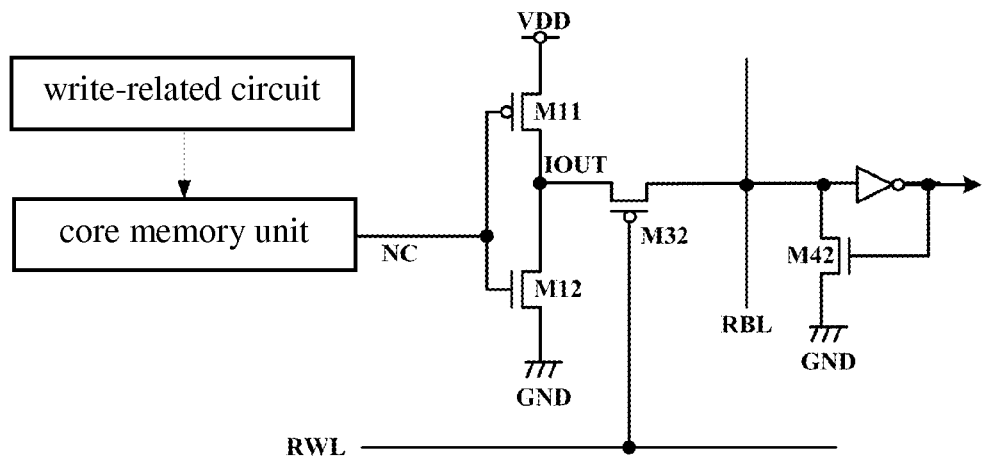
FIG. 4B is a schematic view of an SRAM cell according to an embodiment of the present invention.

In FIG. 4B, an N-type transistor M42 and an inverter together form a positive feedback circuit. One of a source and a drain of M42 is connected to RBL while the other one is connected to the reference level. The input of the inverter is connected to RBL while the output is connected to the gate of M42. If RBL is at a low level due to the output of SRAM cell, the inverter changes the logic low level to a logic high level. As long as the logic high level is lower than a high level required for turning on the N-type transistor, the N-type transistor is turned on, and thus RBL is further pulled down to a low level close to the reference level.

It can be seen that, this positive feedback circuit is good for compensating the degradation of RBL low level driving ability caused by the P-type transistor M32. If RBL is at a high level due to the output of SRAM cell, because a potential difference across the P-type transistor M32 produced at the time of pulling up RBL to the working level is small, the high level on RBL is already very close to the reference level. At this point, the output of the inverter is a low level such that the N-type transistor is cut off.

After introducing the positive feedback circuit as shown in FIG. 4B, the low level on RBL becomes closer to the reference level, such that the dynamic leakage current flowing from working level through M11 and M31 to reference level at the time when RBL is at a low level will be increased. Accordingly, transistor M21 can be added as shown in FIG. 3.

Figure 5:
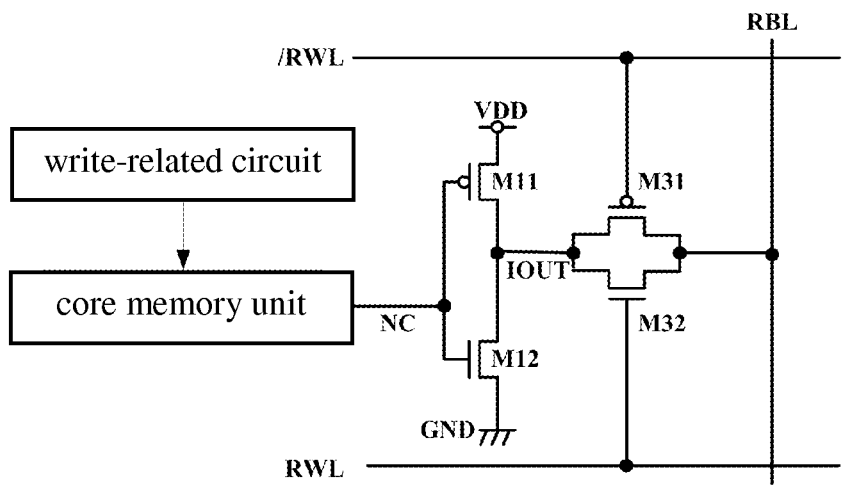
FIG. 5 is a schematic view of an SRAM cell according to an embodiment of the present invention.

According to another embodiment of the present invention, the structure shown in FIG. 5 can be adopted for solving the problem of degradation of driving ability caused by transistor M32. Compared with the structure shown in FIG. 2, in the structure shown in FIG. 5, a transistor M31 of a different type from transistor M32 is added. Specifically speaking, if M32 is an N-type transistor, M31 is a P-type transistor. If M32 is a P-type transistor, M31 is an N-type transistor. M31 and M32 are connected in parallel between node IOUT and RBL, and the gates thereof are respectively connected to complementary signals /RWL and RWL, such that M31 and M32 can be turned on or cut off synchronously.

If it needs to pull up RBL to the working level, the path for current at this point is working level, M11, M31 and RBL. Because P-type transistor has a lot of voids, a potential difference across the P-type transistor is relatively small, such that the high level on RBL becomes closer to the working level. If it needs to pull down RBL to the reference level, the path for current at this point is RBL, M32, M12 and reference level. Because N-type transistor has a lot of voids, a potential difference across the N-type transistor is relatively small, such that the low level on RBL becomes closer to the reference level.

In the structures shown in FIGS. 4A and 4B, the positive feedback circuit is shared among a plurality of SRAM cells, while transistor M31 added in FIG. 5 is provided with regard to each SRAM cell. Thus, in terms of circuit area, the structures shown in FIGS. 4A and 4B are better than that shown in FIG. 5. However, the structure shown in FIG. 5 is better than that shown in FIGS. 4A and 4B in terms of power consumption, because the positive feedback circuit will increase the dynamic leakage current.

Below, a comparison of equivalent power consumption between the structure shown in FIG. 6 and the structure shown in FIG. 1 is given.

Figure 6:
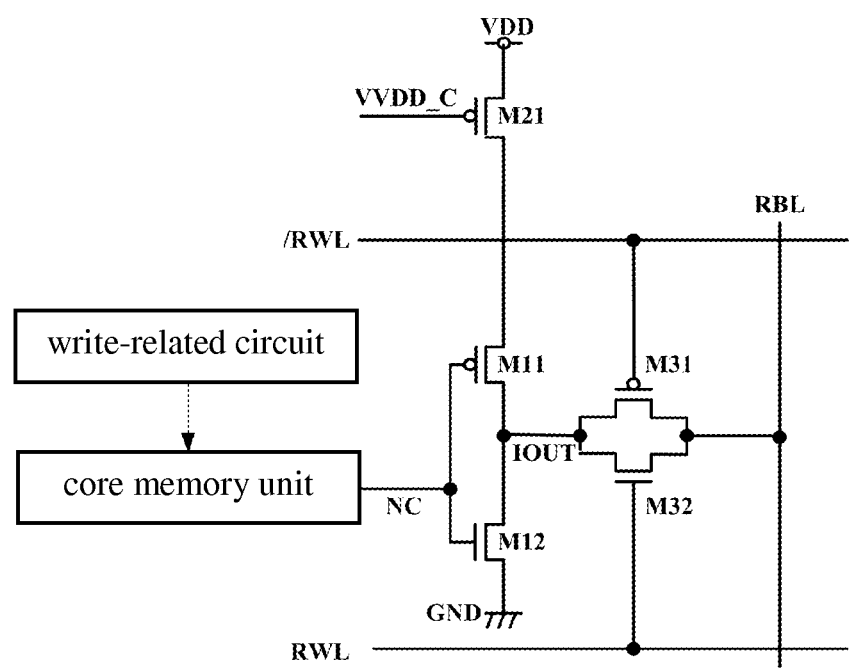
FIG. 6 is a schematic view of an SRAM cell according to an embodiment of the present invention.

| OPERATION | Equivalent power consumption of the structure shown in FIG. 1 (PCEFF) (unit: pF) | Equivalent power consumption of the structure shown in FIG. 6 (PCEFF) (unit: pF) |
| --- | --- | --- |
| READ | 0.36 | 0.29 |
| WRITE | 0.5 | 0.48 |
| HOLD | 0.36 | 0.02 |

From the above table, it can be seen that, if the structure shown in FIG. 6 is adopted, the equivalent power consumption at HOLD operation is reduced significantly. The reason why equivalent power consumption at READ operation and WRITE operation is not obviously reduced is that, READ operation and WRITE operation themselves produce power consumption, while the power consumption produced by leakage current is relatively small compared with the power consumption produced by the operations themselves.

Below, a comparison of leakage current between the structure shown in FIG. 6 and the structure shown in FIG. 1 is given.

| OPERATION | Leakage current of the structure of FIG. 1 (unit: µA) | Leakage current of the structure of FIG. 6 (unit: µA) |
| --- | --- | --- |
| READ | 34.5 | 27.2 |
| WRITE | 42.0 | 3.23 |
| HOLD | 34.4 | 1.67 |

From the above table, it can be seen that, if the structure shown in FIG. 6 is adopted, leakage current at READ operation and HOLD operation is reduced significantly. The reason why the reduction of leakage current at READ operation is small is that, there is no static leakage current but only dynamic leakage current at READ operation.

It can be seen that, if the technical solution according to the embodiments of the present invention is adopted, leakage current can be reduced significantly, and hence the power consumption can be reduced significantly.

Although the respective devices of the present invention have been described in detail in conjunction with the specific embodiments, the present invention is not limited to this. One of ordinary skill in the art can make various variations, replacements and modifications of this invention based on the teaching of the present specification without departing from the spirit and scope of the present invention. It should be understand that all these variations, replacements and modifications fall within scope of this invention. The claimed scope of the present invention is defined by the attached claims.

What is claimed is:

1. An SRAM cell array comprising a plurality of SRAM cells, wherein, said SRAM cell includes a core memory circuit and a write-related circuit, and further comprises:
a first transistor;
a second transistor; and
a third transistor, wherein:
one of a source and a drain of said first transistor is connected to a working level, while the other one is connected to an intermediate output node,
one of a source and a drain of said second transistor is connected to a reference level, while the other one is connected to said intermediate output node,
gates of said first transistor and said second transistor both are connected to an output node of said core memory circuit,
one of said first transistor and said second transistor is an N-type transistor while the other one is a P-type transistor, and
one of a source and a drain of said third transistor is connected to said intermediate output node, while the other one is connected to a read bit line, and
a gate of said third transistor is connected to a read word line;
the SRAM cell array further comprising:
a fourth transistor,
wherein one of the source and the drain of said first transistor is connected to said working level by said fourth transistor,
wherein one of a source and a drain of said fourth transistor is connected to one of the source and the drain of said first transistor while the other one is connected to said working level, and
wherein a gate of said fourth transistor is connected to a first read control signal, which enables said fourth transistor to be turned on during period of performing a read operation on said SRAM cell;
the SRAM cell further comprising:
a fifth transistor,
wherein one of the source and the drain of said second transistor is connected to said reference level by said fifth transistor,
wherein one of a source and a drain of said fifth transistor is connected to one of the source and the drain of said second transistor while the other one is connected to said reference level,
wherein a gate of said fifth transistor is connected to a second read control signal, which enables said fifth transistor to be turned on during period of performing a read operation on said SRAM cell, and
wherein the channel dimension of said fourth transistor and said fifth transistor is greater than two times the channel dimension of said first transistor and said second transistor.

2. The SRAM cell array of claim 1, wherein said fourth transistor has a channel dimension larger than that of said first transistor, said second transistor and said third transistor.

* * * * *